United States Patent
Jen (10) Patent No.: US 7,106,418 B2
(45) Date of Patent: Sep. 12, 2006

(54) SCANNING EXPOSURE METHOD AND AN APPARATUS THEREOF

(75) Inventor: Tean-Sen Jen, Ping Chen (TW)

(73) Assignee: Hannstar Display Corporation, Taipei (TW)

(*) Notice: Subject to any disclaimer, the term of this patent is extended or adjusted under 35 U.S.C. 154(b) by 99 days.

(21) Appl. No.: 10/841,306

(22) Filed: May 6, 2004

(65) Prior Publication Data
US 2005/0094117 A1    May 5, 2005

(30) Foreign Application Priority Data
Oct. 29, 2003  (TW) .............................. 92130120 A (51) Int. Cl.
*G03B 27/42* (2006.01)
*G03B 27/54* (2006.01)

(52) U.S. Cl. .......................... 355/53; 355/67

(58) Field of Classification Search ............... 355/52, 355/53, 55, 67, 77; 356/399–401; 250/548; 430/311
See application file for complete search history.

(56) References Cited

U.S. PATENT DOCUMENTS

| 5,437,946 A | * | 8/1995 | McCoy .......................... 430/5 |
| 6,151,099 A | * | 11/2000 | Okamura et al. ............ 355/47 |
| 6,323,937 B1 | * | 11/2001 | Sano ........................... 355/69 |
| 6,542,223 B1 | * | 4/2003 | Okazaki ....................... 355/67 |

* cited by examiner

*Primary Examiner*—Henry Hung Nguyen
(74) *Attorney, Agent, or Firm*—Michael A. Glenn; Glenn Patent Group (57) ABSTRACT

A light source and a substrate are placed above and below a mask having a mask pattern thereon, respectively. Relative to the mask, the light source is moved in a first direction at a first speed, and the substrate is moved in a second direction at a second speed. The light of the light source transfers the mask pattern to a photoresist layer on the substrate, and forms a photoresist pattern thereof.

11 Claims, 7 Drawing Sheets

SCANNING EXPOSURE METHOD AND AN APPARATUS THEREOF

BACKGROUND

1. Field of Invention

The present invention relates to a manufacturing apparatus and method for a semiconductor. More particularly, the present invention relates to a scanning exposure method and an apparatus thereof.

2. Description of Related Art

Liquid crystal display (LCD) has many advantages over other conventional types of displays including high display quality, small volume, light weight, low driving voltage and low power consumption. Large size, high resolution, wide view and rapid response time are the main demands on the LCDs. From the LCDs used in desktop computers to the popular liquid crystal televisions, and further the ultra large LCDs, the size of the LCDs is increasingly great.

Figure 1A:
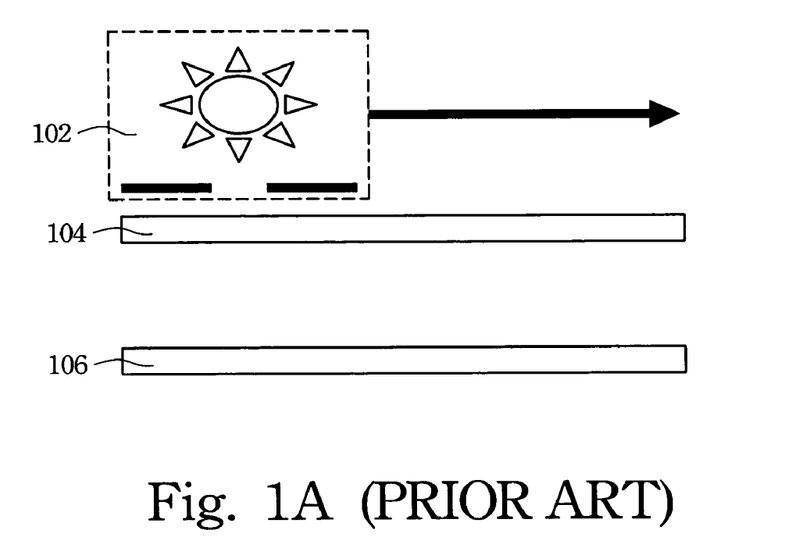
FIG. 1A illustrates a schematic view of a conventional scanning exposure apparatus.

Generally, the exposure manufacturing process of the large-size LCD is carried out by a scanning exposure method. FIG. 1A illustrates a schematic view of a conventional scanning exposure apparatus. As illustrated in FIG. 1A, the conventional scanning exposure apparatus fixes the positions of a mask 104 and a substrate 106, and moves a light source 102 from one side of the mask 104 to the other side thereof for scanning the whole mask 104. The light of the light source 102 therefore completely transfers a mask pattern of the mask 104 to a photoresist layer of the substrate 106.

Figure 1B:
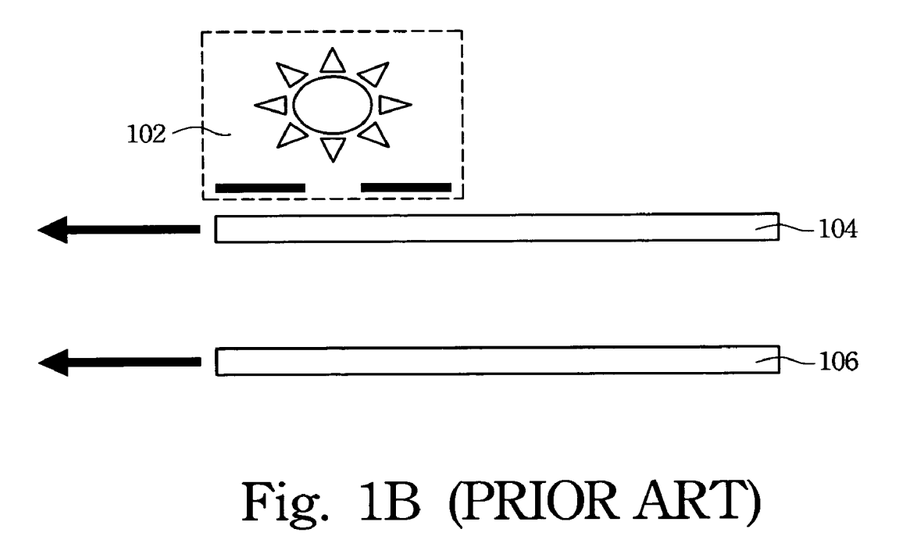
FIG. 1B illustrates a schematic view of another conventional scanning exposure apparatus.

FIG. 1B illustrates a schematic view of another conventional scanning exposure apparatus. In contrast to the apparatus in FIG. 1A, the scanning exposure apparatus in FIG. 1B fixes the position of the light source 102, and moves the mask 104 and the substrate 106 synchronously. The same result as that of FIG. 1A is thus attained.

In these conventional scanning exposure apparatuses, with their single-scan exposure procedure, the size of the mask 104 is limited to the size of the substrate 106. The sizes of the modern LCDs are greater, and if the conventional scanning exposure apparatus is used to manufacture the large-size LCDs, the size of the mask thereof has to be greater or, alternatively, a multiple scan exposure procedure has to be used. However, when the size of the mask is greater, the manufacturing cost thereof is very expensive and the yield thereof is also suboptimal. Moreover, the increase of the size of the mask has ultimate limitation. Hence, considering the quality and cost, one conventional method uses a seamless procedure to combine small-size liquid crystal panels and obtain a large-size LCD. But the seamless procedure sometimes joins poorly, thus generating many problems.

SUMMARY

It is therefore an objective of the present invention to provide a scanning exposure method that fixes the position of the mask and simultaneously moves the light source and the substrate, thus shrinking the size of the mask, reducing the manufacturing cost and improving the yield thereof.

It is another an objective of the present invention to provide a scanning exposure apparatus that controls the velocities of the light source and the substrate relative to the mask, thus magnifying the mask pattern onto the photoresist layer of the substrate.

It is still another an objective of the present invention to provide a scanning exposure method in which a negative mask pattern is used with a negative photoresist layer. The size of the slit of the light source therefore does not have to be less than the critical dimension of the mask pattern, thus reducing the time of exposure.

It is still another an objective of the present invention to provide a scanning exposure apparatus that moves the light source to control the period of exposure, and moves the substrate in the period to extend the mask pattern. A small-size mask can thus be used for the exposure procedure of a large-size substrate.

In accordance with the foregoing and other objectives of the present invention, a scanning exposure method is provided. A light source and a substrate are placed above and below a mask having a mask pattern thereon, respectively. Relative to the mask, the light source is moved toward a first direction at a first speed, and the substrate is moved toward a second direction at a second speed. The light of the light source transfers the mask pattern to a photoresist layer on the substrate, and forms a photoresist pattern thereof.

According to one preferred embodiment of the present invention, the light source comprises a slit. When the mask pattern is a positive mask pattern, a size of the slit in the first direction is less than a critical dimension of the mask in the first direction, and a material of the photoresist layer is positive photoresist. On the other hand, when the mask pattern is a negative mask pattern, a size of the slit in the first direction is greater than a critical dimension of the mask in the first direction, and the material of the photoresist layer is negative photoresist.

According to another preferred embodiment of the present invention, the first direction is opposite to the second direction, in other words, the light source and the substrates are moved in opposite directions. A size of the photoresist pattern in the second direction is equal to a size of the mask pattern in the first direction multiplied by a sum of the first speed and the second speed, and divided by the first speed.

In conclusion, the invention provides a scanning exposure method that fixes the position of the mask and simultaneously moves the light source and the substrate, thus shrinking the size of the mask, reducing the manufacturing cost and improving the yield thereof. Moreover, the invention uses the small-size mask in the exposure procedure of the large-size substrate, and avoids the faulty joints seen in the conventional seamless procedure to produce a large-size LCD. In addition, the invention discloses a method using a negative mask pattern with a negative photoresist layer. The size of the slit of the light source therefore does not have to be less than the critical dimension of the mask pattern, thus reducing the time of exposure and enhancing the manufacturing efficiency.

It is to be understood that both the foregoing general description and the following detailed description are examples, and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings, where:

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 2A:
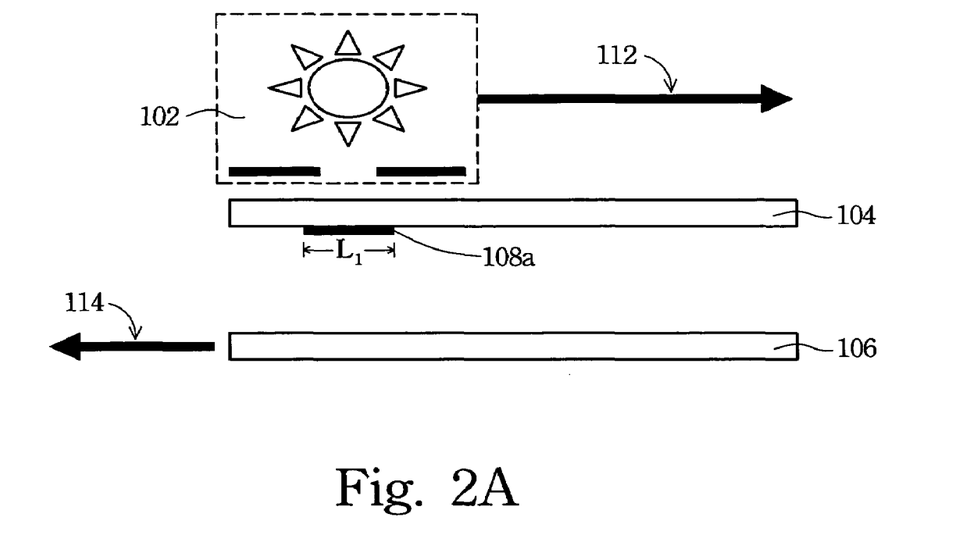
FIG. 2A illustrates a schematic view of one preferred embodiment of the invention.

FIG. 2A illustrates a schematic view of one preferred embodiment of the invention. As illustrated in FIG. 2A, a light source 102 and a substrate 106 are placed above and below a mask 104 having a positive mask pattern 108a thereon, respectively. The light source 102 is moved in a first direction 112 relative to the mask 104 at a first speed, and the substrate 106 is moved in a second direction at a second speed. The light of the light source 102 transfers the positive mask pattern 108a of the mask 104 to a photoresist layer (not illustrated in FIG. 2A) on the substrate 106, and forms a photoresist pattern thereof.

In the invention, a period in which the light of the light source 102 is blocked by the positive mask pattern 108a of the mask 104 is regarded as a block period, and the block period is equal to a size of the positive mask pattern 108a in the direction of movement (i.e. the first direction 112) of the light source 102 divided by the velocity (i.e. the first speed) of the light source 102. If the size of the positive mask pattern 108a in the first direction 112 is $L_1$, and the velocity of the light source 102 is $V_1$, the block period t is $$t = \frac{L_1}{V_1} \quad (1)$$

At the same time, the substrate 106 above the mask 104 is moved in the second direction 114 at the second speed. Therefore, in the block period t, besides the original area of the photoresist pattern directly blocked by the positive mask pattern 108a, an extension area thereof is extended along the direction of movement of the substrate 106 (i.e. the second direction 114) because of the movement of the substrate 106. If the velocity of the substrate 106 is $V_2$, a size $L_2$ of the extension area of the photoresist pattern in the second direction 114 is $$L_2 = V_2 \cdot t = V_2 \frac{L_1}{V_1} \quad (2)$$

Figure 2B:
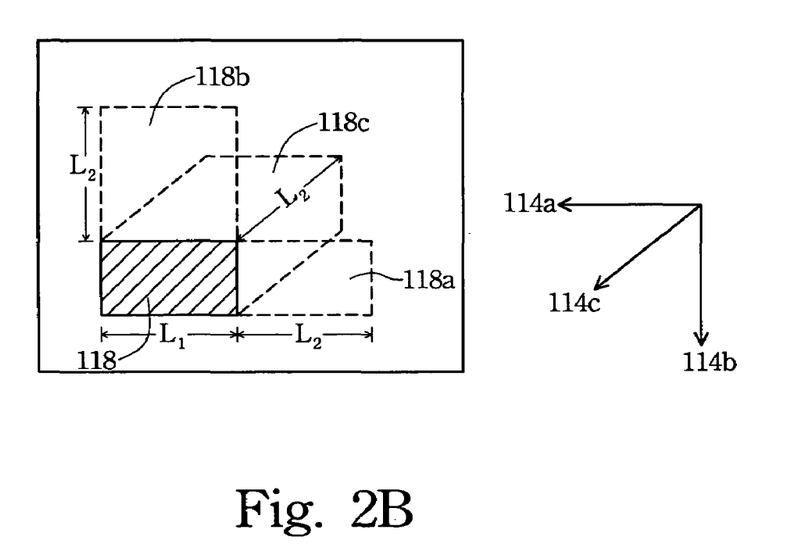
FIG. 2B illustrates a top view of the photoresist pattern of FIG. 2A.

FIG. 2B illustrates a top view of the photoresist pattern of one preferred embodiment of the invention, and with FIG. 2A interprets a relationship between the photoresist pattern and the direction of movement of the substrate of the invention. As illustrated in FIG. 2B, when the substrate 106 is moved in the second direction 114a, besides the original area 118 of the photoresist pattern directly blocked by the positive mask pattern 108a, an extension area 118a thereof is extended along the direction of movement of the substrate 106 because of the movement of the substrate 106, and the size of the extension area 118a is $L_2$.

In addition, the direction of movement of the light source 102 can be not parallel to the direction of movement of the substrate 106. As illustrated in FIG. 2B, when the substrate 106 is moved in a second direction 114b, an extension area 118b of the photoresist pattern is extended along the second direction 114b; when the substrate 106 is moved in a second direction 114c, an extension area 118c of the photoresist pattern is extended along the second direction 114c of the substrate 106.

In one aspect, the moving of the light source 102 controls the block or exposure periods of the mask pattern, and in the block or exposure periods, the moving of the substrate 106 controls the extension area of the photoresist pattern. In the other aspect, the invention enlarges the photoresist pattern by moving the substrate 106. In other words, the invention shrinks the size of the mask 104, thus the size of the mask 104 is less than the size of the substrate 106.

As described above, the photoresist pattern on the substrate 106 is a sum of the mask pattern and the extension area therefrom. For example, in FIG. 2B, when the substrate 106 is moved in the second direction 114a, the photoresist pattern transferred from the mask pattern is the sum of the original area 118 and the extension area 118a. The size $L_3$ of the photoresist pattern in the direction of movement (i.e. the second direction) of the substrate 106 is presented as $$L_3 = L_1 + L_2 = L_1 + \frac{L_1}{V_1} V_2 = \left(\frac{V_1 + V_2}{V_1}\right) \cdot L_1 \quad (3)$$

Figure 3A:
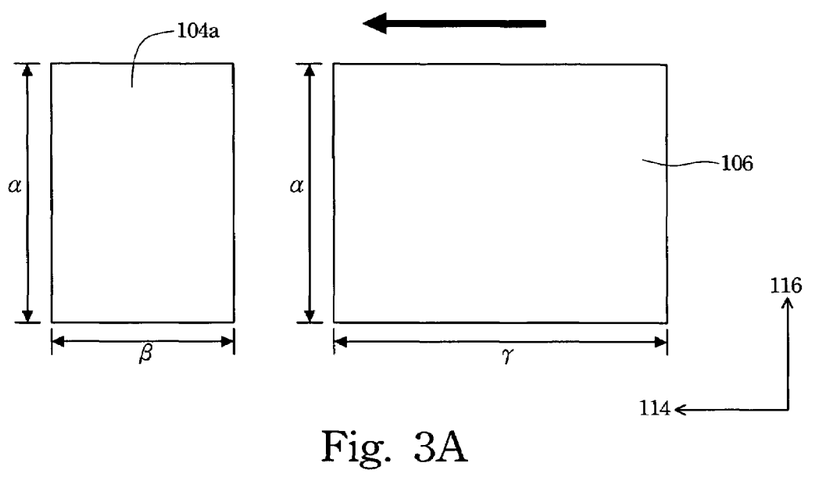
FIG. 3A illustrates a schematic view of the mask and the substrate of one preferred embodiment of the invention.

The size of the mask pattern of the invention is only enlarged along the direction of movement (i.e. the second direction) of the substrate. Therefore, along the direction perpendicular to the direction of movement of the substrate, the size of the photoresist pattern is equal to the size of the mask pattern. FIG. 3A illustrates a schematic view of the mask and the substrate of one preferred embodiment of the invention. The following descriptions interpret a relationship between the mask and the substrate of the invention with FIG. 3A and FIG. 2A.

For ease of interpretation, it is assumed that the first direction 112 and the second direction 114 in FIG. 2A are on the same line and opposite to each other. The size of the mask pattern along the direction of movement of the light source 102 is therefore the same as the size of the mask pattern along the direction of movement of the substrate 106. According to the foregoing equation (3), in direction 114, a relationship between the size γ of the substrate 106 and the size β if the mask 104a is $$\gamma = \left(\frac{V_1 + V_2}{V_1}\right) \cdot \beta \quad (4)$$

Figure 3B:
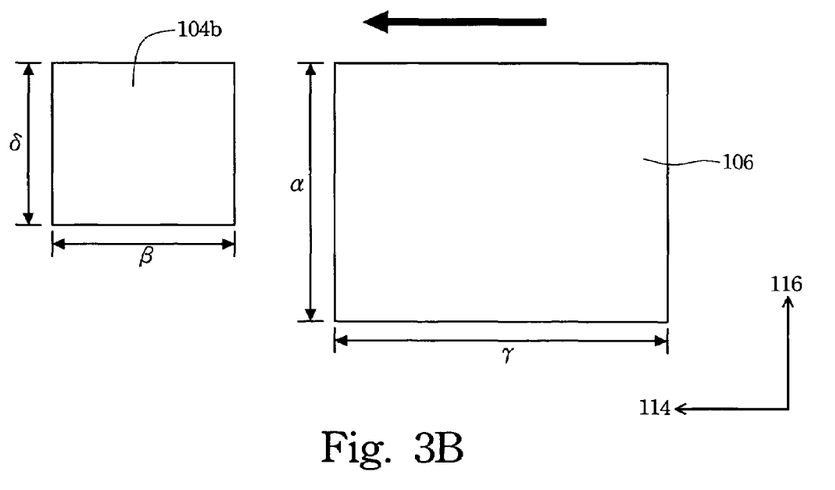
FIG. 3B illustrates a schematic view of the mask and the substrate of another preferred embodiment of the invention.

And in direction 116, if the size α of the mask 104a is equal to the size α of the substrate 106, the whole substrate 106 can be completely exposed by the mask 104a in single scan exposure procedure. If the size δ of the mask 104b is less than the size α of the substrate 106, the whole substrate 106 is completely exposed by the mask 104b in a multiple scan exposure procedure.

Figure 3C:
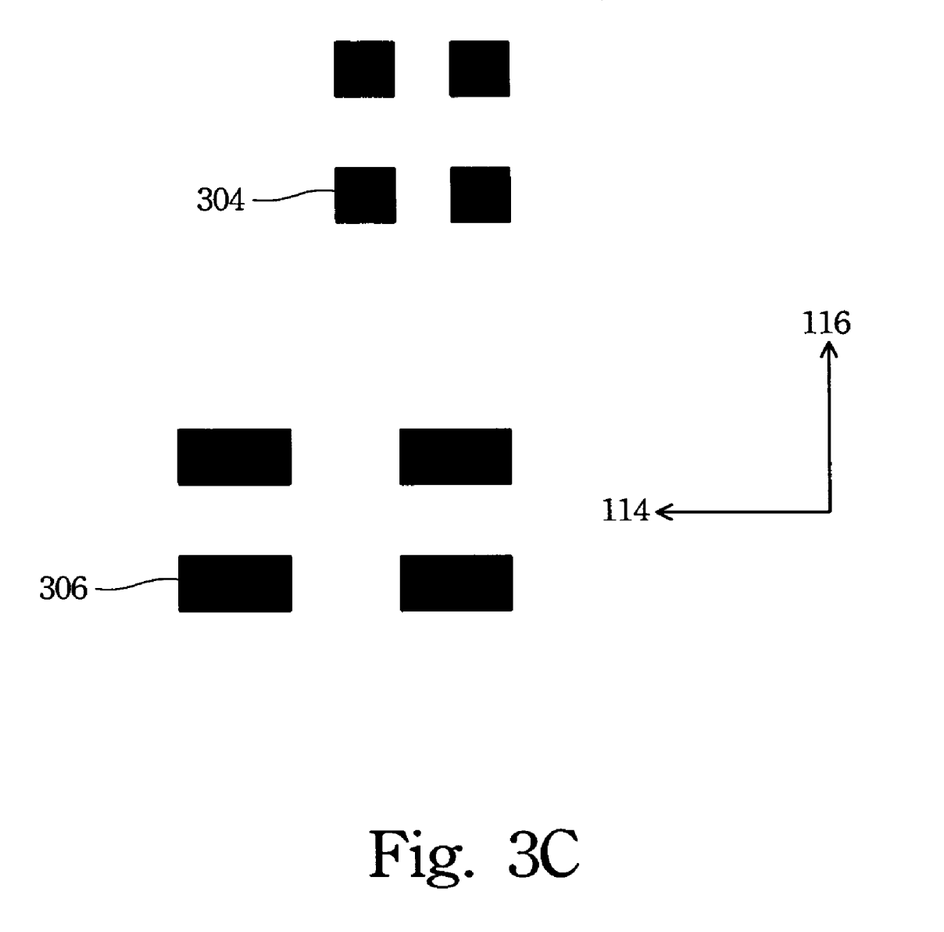
FIG. 3C illustrates a top view of a mask pattern and a photoresist pattern of one preferred embodiment of the invention.

FIG. 3C illustrates a top view of a mask pattern and a photoresist pattern of one preferred embodiment of the invention. As illustrated in FIG. 3C, when the substrate 106 is moved in the second direction 114, the mask pattern 304 is enlarged and transferred to a photoresist pattern 306, and the magnifying power thereof is decided by the velocity $V_1$, of the light source 102, the velocity $V_2$ of the substrate 106, the size $L_1$ of the mask pattern 302 along the direction of movement of the light source 102 and the size of the mask pattern 302 along the direction of movement of the substrate.

The following descriptions illustrates a relationship of the light source and the mask of the invention by two preferred embodiments, and more especially focuses on a relationship between the size of a slit of the light source and a critical dimension of a positive or negative mask pattern.

THE FIRST EMODIMENT

The first embodiment illustrates that when the mask pattern is a positive mask pattern, the size of the slit of the light source must be less than the critical dimension of the positive mask pattern.

Figure 4A:
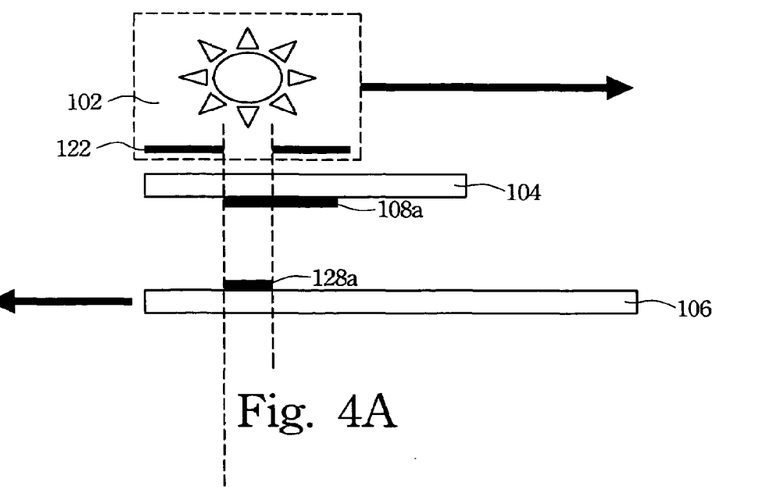
FIG. 4A illustrates a schematic view of an initial condition of the first embodiment of the invention.
Figure 4B:
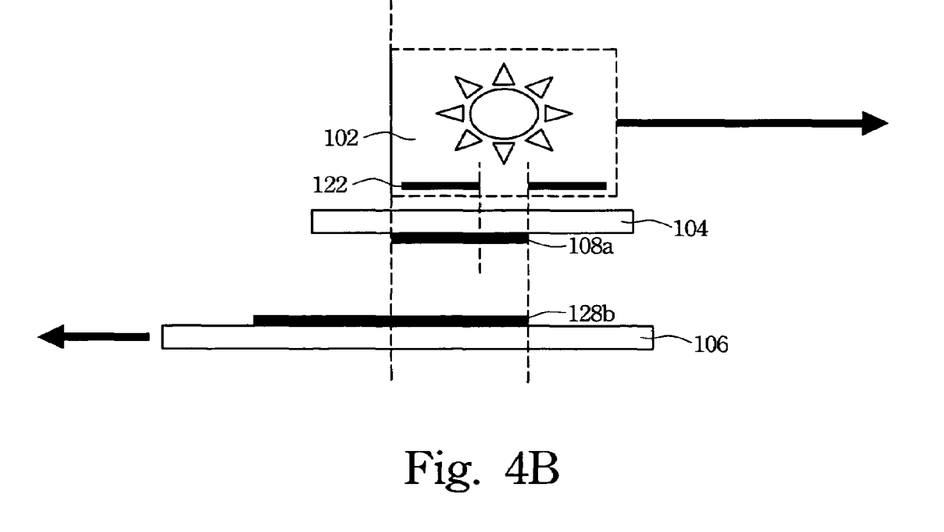
FIG. 4B illustrates a schematic view of the first embodiment of the invention after time t.

FIG. 4A illustrates a schematic view of an initial condition of the first embodiment of the invention, and FIG. 4B illustrates a schematic view of the first embodiment of the invention after time t. It is noted that the photoresist pattern 128a and 128b in FIG. 4A and FIG. 4B, respectively, only illustrate the portions of the photoresist layer on the substrate 106 not exposed by the light of light source 102.

In the first embodiment, it is assumed that the light source 102 and the substrate 106 are moved in opposite directions at the same speed relative to the mask 104. The light source 102 has a slit 122 that controls the size of the light thereof illuminating the mask 104. Moreover, the mask pattern of the mask 104 is a positive mask pattern 108a, and a material of the photoresist layer on the substrate 106 is a positive photoresist. The positive photoresist is made of a light sensitive material that dissolves when it is illuminated, and then is removed by a development process. Other portions of the photoresist layer not illuminated by the light source 102 are reserved in the development process.

As illustrated in FIG. 4A, a size of the slit 122 is less than the dimension of the positive mask pattern 108a. When the light of the light source 102 is fully blocked by one side of the positive mask pattern 108a, the photoresist layer on the substrate 106 starts to form a photoresist pattern 128a. Then the light source 102 and the substrate 106 are continuously moved in opposite directions at the same speed. When the light of the light source 102 reaches the other side of the positive mask pattern 108a, according the foregoing equation (3), in the direction of movement of the substrate 106, the size of the photoresist pattern 128a is the double the size of the positive mask pattern 108a, as illustrated in FIG. 4B.

Figure 5A:
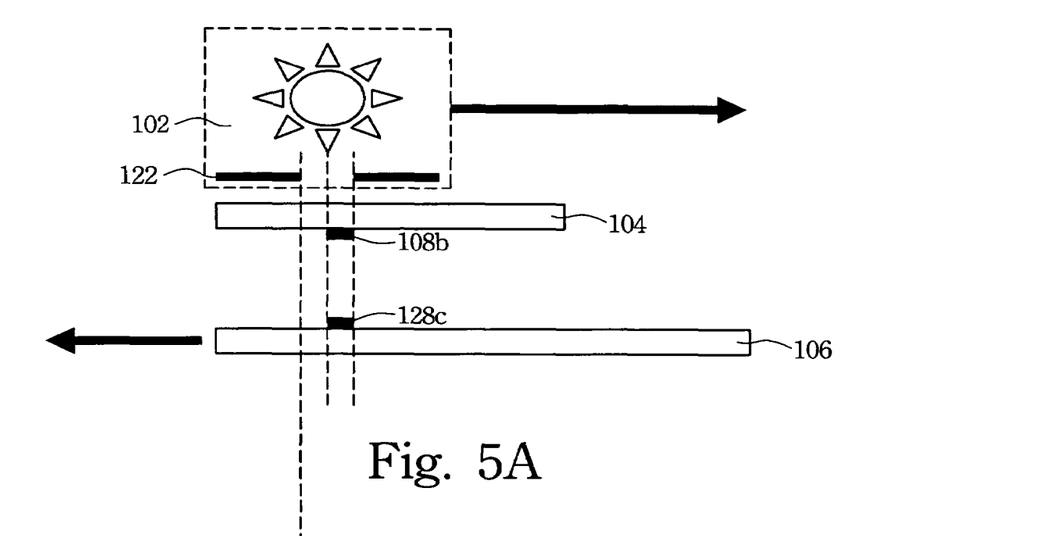
FIG. 5A illustrates a schematic view of an initial condition of one false scanning exposure method.
Figure 5B:
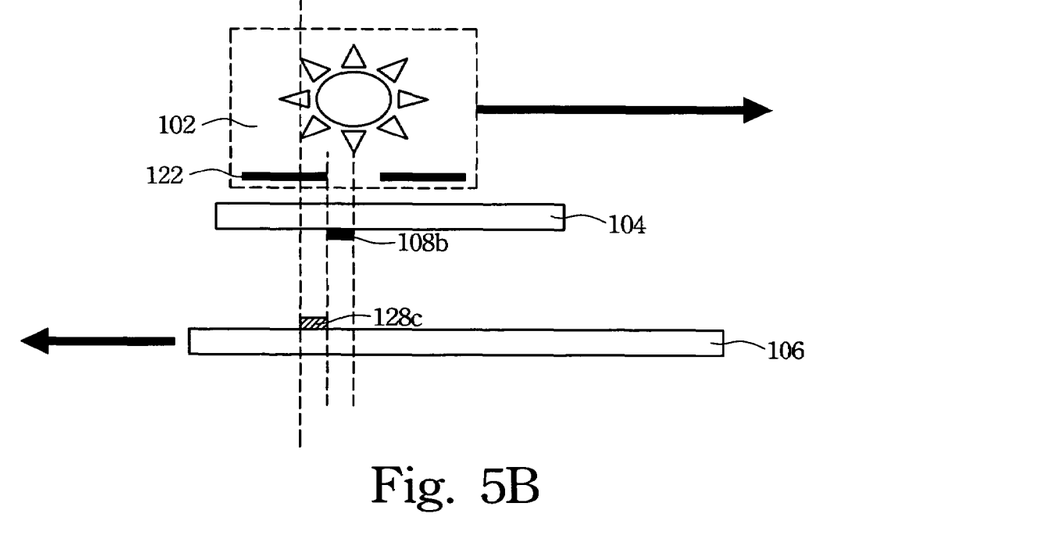
FIG. 5B illustrates a schematic view of one false scanning exposure method after time t.

However, the invention provides an exposure method in scanning type, especially when the light source and the substrate are moved relative to the mask, that requires the size of the slit of the light source to be less than the critical dimension of the positive mask pattern when the method uses the positive mask pattern as described above. FIG. 5A and FIG. 5B interpret the failure of the method if the size of the slit of the light source is greater than the critical dimension of the positive mask pattern.

Most conditions in FIG. 5A and FIG. 5B are the same as in the first embodiment, and the only difference therebetween is, in FIG. 5A and FIG. 5B, that the size of the slit 122 is larger than the dimension of the positive mask pattern 108b. When the light of the light source 102 is fully blocked by one side of the positive mask pattern 108b, the photoresist layer on the substrate 106 starts to form a photoresist pattern 128c, as illustrated in FIG. 5A. Then the light source 102 and the substrate 106 are continuously moved in opposite directions at the same speed. When the light of the light source 102 reaches the other side of the positive mask pattern 108b, the photoresist pattern formed in FIG. 5A is illuminated by the light of the light source 102 during the moving, and therefore is exposed and can't be reserved, as illustrated in FIG. 5B.

Accordingly, when the mask 102 of the invention has the positive mask pattern thereon, in order to prevent the foregoing problems, the size of the slit 122 must be adjusted to be less than the dimension of the positive mask pattern. However, the small-size slit reduces the light density of the light source 102, and thus prolongs the time of exposure and lowers the manufacturing efficiency of the LCDs. Enhancing the light power of the light source 102 or alternating a high-sensitive photoresist may decrease the time of exposure, but enhancing the light power has technical and cost limitations, and easily generates excessive heat. The cost of the high-sensitive photoresist is very high.

Hence, the following second embodiment uses a negative mask pattern instead of the positive mask pattern in the first embodiment, and a negative photoresist layer, thus obviating the need for the size of the slit of the light source to be less than the critical dimension of the mask pattern. By this method, the size of the slit can be enlarged to increase the light density thereof, so as to reduce the time of exposure.

THE SECOND EMBODIMENT

The second embodiment illustrates that when the mask pattern is a negative mask pattern, the size of the slit of the light source must be greater than the critical dimension of the negative mask pattern.

Figure 6A:
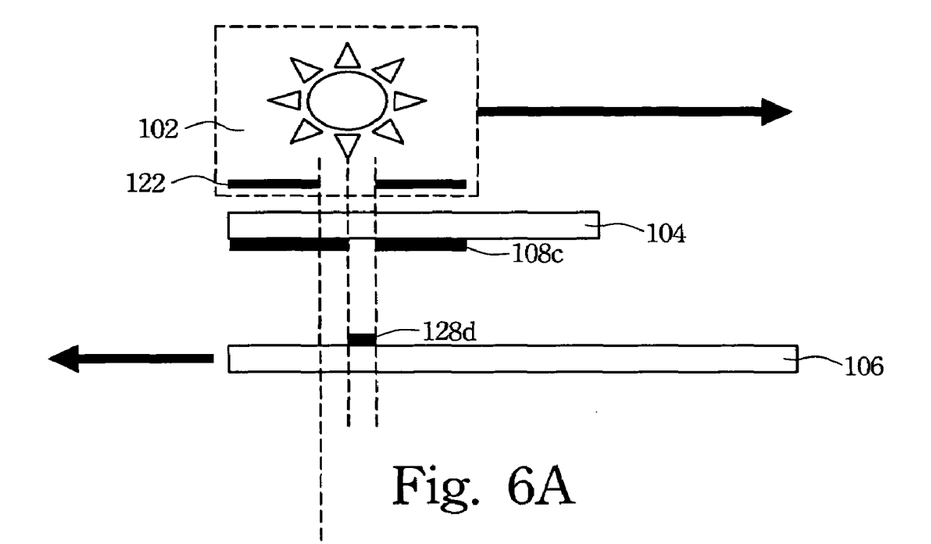
FIG. 6A illustrates a schematic view of an initial condition of the second embodiment of the invention.
Figure 6B:
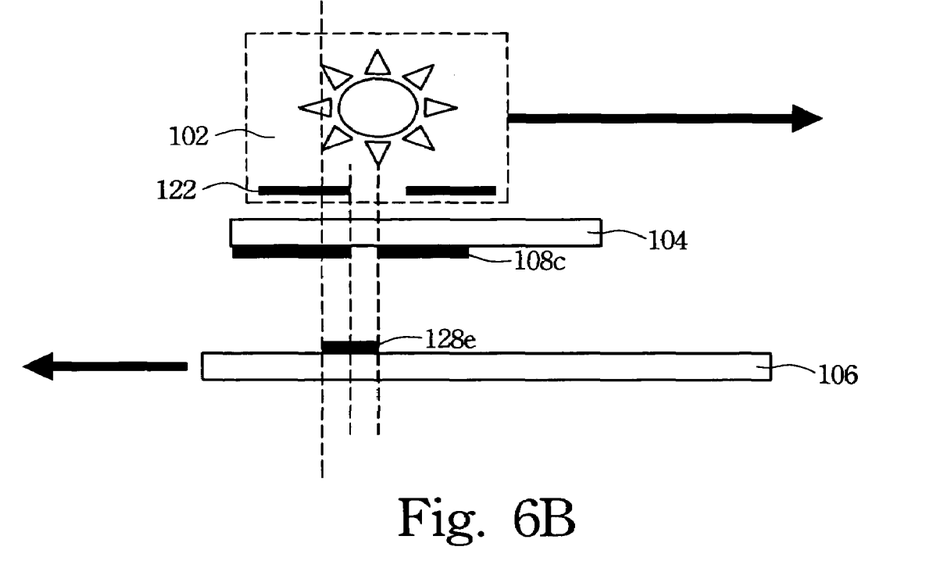
FIG. 6B illustrates a schematic view of the second embodiment of the invention after time t.

FIG. 6A illustrates a schematic view of an initial condition of the second embodiment of the invention, and FIG. 6B illustrates a schematic view of the second embodiment of the invention after time t. It is noted that the photoresist pattern 128d and 128e in FIG. 6A and FIG. 6B, respectively, only illustrate the portions of the photoresist layer on the substrate 106 exposed by light from light source 102.

In the second embodiment, it is assumed that the light source 102 and the substrate 106 are moved in opposite directions at the same speed relative to the mask 104. The light source 102 has a slit 122 that controls the size of the light illuminating on the mask 104. Moreover, the mask pattern of the mask 104 is a negative mask pattern 108c, and a material of the photoresist layer on the substrate 106 is a negative photoresist. The negative photoresist is made of a light sensitive material that dissolves in the development process if it has not been illuminated. Other portions of the photoresist layer illuminated by the light source 102 are removed in the development process.

As illustrated in FIG. 6A, a size of the slit 122 is greater than the dimension of the positive mask pattern 108c. When the light of the light source 102 fully passes through one side of the negative mask pattern 108c, the photoresist layer on the substrate 106 starts to form a photoresist pattern 128d. Then the light source 102 and the substrate 106 are continuously moved in opposite directions at the same speed. When the light of the light source 102 reaches the other side of the positive mask pattern 108c, according to the foregoing equation (3), the size of the photoresist pattern 128e along the direction of movement of the substrate 106 is double the size of the positive mask pattern 108c, as illustrated in FIG. 6B.

In conclusion, the invention provides a scanning exposure method that fixes the position of the mask and simultaneously moves the light source and the substrate, thus shrinking the size of the mask, reducing the manufacturing cost and improving the yield thereof. Moreover, the invention uses a small-size mask for the exposure procedure of the large-size substrate, and avoids the bad joints resulting from the conventional seamless procedure for manufacturing large-size LCDs. In addition, the invention discloses a method that uses a negative mask pattern with a negative photoresist layer. The size of the slit of the light source therefore does not have to be less than the critical dimension of the mask pattern, thus reducing the time of exposure and enhancing the manufacturing efficiency.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A scanning exposure method, comprising:
    providing a light source and a substrate, wherein the substrate has a photoresist layer;
    placing a mask between the light source and the substrate, wherein the mask has a mask pattern; and
    relative to the mask, moving the light source in a first direction at a first speed, and moving the substrate in a second direction at a second speed, such that light of the light source transfers the mask pattern to a photoresist pattern on the photoresist layer, wherein the first direction is opposite to the second direction, and a size of the photoresist pattern along the second direction is equal to a size of the mask pattern along the second direction multiplied by a sum of the first speed and the second speed and divided by the first speed.

2. The method of claim 1, wherein the light source comprises a slit.

3. The method of claim 2, wherein when the mask pattern is a positive mask pattern, a size of the slit along the first direction is less than a critical dimension of the positive mask pattern along the first direction.

4. The method of claim 3, wherein a material of the photoresist layer is a positive photoresist.

5. The method of claim 2, wherein when the mask pattern is a negative mask pattern, a size of the slit along the first direction is greater than a critical dimension of the negative mask pattern along the first direction.

6. The method of claim 5, wherein a material of the photoresist layer is a negative photoresist.

7. A scanning exposure apparatus, comprising:
    a mask having a mask pattern;
    a light source having a silt, wherein the light source is above the mask, and is moved in a first direction at a first speed relative to the mask; and
    a holder, holding a substrate having a photoresist layer, wherein the holder is below the mask, and the holder is moved in a second direction at a second speed relative to the mask, such that the light of the light source transfers the mask pattern to a photoresist pattern on the photoresist layer, wherein the first direction is opposite to the second direction, and a size of the photoresist pattern along the second direction is equal to a size of the mask pattern along the second direction multiplied by a sum of the first speed and the second speed and divided by the first speed.

8. The apparatus of claim 7, wherein when the mask pattern is a positive mask pattern, a size of the slit along the first direction is less than a critical dimension of the positive mask pattern along the first direction.

9. The apparatus of claim 8, wherein a material of the photoresist layer is a positive photoresist.

10. The apparatus of claim 7, wherein when the mask pattern is a negative mask pattern, a size of the slit along the first direction is greater than a critical dimension of the negative mask pattern along the first direction.

11. The apparatus of claim 10, wherein a material of the photoresist layer is a negative photoresist.

* * * * *